(12) United States Patent
Kamigaichi

(10) Patent No.: US 9,012,969 B2
(45) Date of Patent: Apr. 21, 2015

(54) NONVOLATILE SEMICONDUCTOR MEMORY DEVICE AND METHOD FOR MANUFACTURING THE SAME

(75) Inventor: Takeshi Kamigaichi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 676 days.

(21) Appl. No.: 13/237,545

(22) Filed: Sep. 20, 2011

(65) Prior Publication Data

US 2012/0235222 A1    Sep. 20, 2012

(30) Foreign Application Priority Data

Mar. 18, 2011    (JP) .................................. 2011-061353

(51) Int. Cl.
| H01L 29/788 | (2006.01) |
| H01L 27/115 | (2006.01) |
| H01L 29/792 | (2006.01) |
| H01L 21/762 | (2006.01) |

(52) U.S. Cl.
CPC .... H01L 27/11524 (2013.01); H01L 27/11519 (2013.01); H01L 29/792 (2013.01); H01L 21/76229 (2013.01)

(58) Field of Classification Search
CPC .............. H01L 21/76; H01L 27/11519; H01L 21/76229; H01L 29/72; H01L 27/11524; H01L 27/11529; H01L 29/66825
USPC .............. 257/261, 296, 314–321, 324, E29.3, 257/E29.309, E21.691, E27.084, E21.209, 257/E21.645, E21.646; 438/257, 266; 365/63, 185.23

See application file for complete search history.

(56) References Cited

U.S. PATENT DOCUMENTS

| 5,946,230 | A  | * | 8/1999  | Shimizu et al. ........... 365/185.01 |
| 6,121,670 | A  | * | 9/2000  | Hisamune ...................... 257/623 |
| 6,458,655 | B1 | * | 10/2002 | Yuzuriha et al. .............. 438/257 |
| 7,079,437 | B2 | * | 7/2006  | Hazama et al. ........... 365/210.12 |
| 7,863,668 | B2 | * | 1/2011  | Takahashi ...................... 257/315 |
| 8,283,717 | B2 | * | 10/2012 | Matsunami et al. .......... 257/315 |
| 8,525,246 | B2 | * | 9/2013  | Kato et al. ..................... 257/314 |
| 2005/0167732 | A1 | * | 8/2005 | Iguchi et al. .................. 257/315 |
| 2006/0035437 | A1 | * | 2/2006 | Mitsuhira et al. ............. 438/424 |
| 2007/0145472 | A1 | * | 6/2007 | Kwak ............................ 257/321 |
| 2007/0195595 | A1 | * | 8/2007 | Seo et al. ................. 365/185.01 |
| 2010/0224927 | A1 | * | 9/2010 | Ishihara et al. ............... 257/324 |
| 2010/0246255 | A1 |   | 9/2010 | Shiino et al. |
| 2011/0051527 | A1 | * | 3/2011 | Kirisawa et al. ......... 365/185.29 |
| 2011/0108901 | A1 | * | 5/2011 | Matsunami et al. .......... 257/315 |

FOREIGN PATENT DOCUMENTS

JP    2010-250891    11/2010

* cited by examiner

Primary Examiner — Cuong Q Nguyen
Assistant Examiner — Yosef Gebreyesus
(74) Attorney, Agent, or Firm — Oblon, McClelland, Maier & Neustadt, L.L.P.

(57) ABSTRACT

A device isolation film has a first height in a first area and a second height higher than the first height in a second area. The first area includes a first end of a dummy memory transistor facing a memory string and a part of a device isolation film adjacent thereof. The second area includes a second end of the dummy memory transistor facing a select transistor and a part of the device isolation film adjacent thereof.

10 Claims, 16 Drawing Sheets

US 9,012,969 B2
NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-061353, filed on Mar. 18, 2011, the entire contents of which are incorporated herein by reference.

FIELD

Embodiments described herein relate to a nonvolatile semiconductor memory device and a method for manufacturing the same.

BACKGROUND

In recent years, a semiconductor memory device such as NAND flash memory is mounted on many electronic devices. Along with a demand for multifunctional electronic devices, an increase in storage capacity is needed for the semiconductor memory device and correspondingly miniaturization of memory element is needed.

A NAND flash memory typically employs a MOSFET memory transistor in which a floating gate and a control gate are stacked. For the NAND flash memory, a NAND cell unit in which such memory transistors are connected in series is configured. One end of the NAND cell unit is connected to a bit line via a select transistor and the other end thereof is similarly connected to a source line via a select transistor.

With the development of scaling down, there is known a NAND flash memory in which a dummy memory transistor is connected between a memory string and a select transistor. The dummy memory transistor has substantially the same structure as a typical memory transistor but is not used for storing data.

DETAILED DESCRIPTION

A nonvolatile semiconductor memory device according to embodiments herein includes a semiconductor layer, an active area, and a device isolation film. The semiconductor layer has a first area and a second area. The active area is formed in the semiconductor layer, and includes a memory string including memory transistors connected in series, a dummy memory transistor connected to one end of the memory string and is not used for storing data, and a select transistor connected to one end of the memory string via the dummy memory transistor. The device isolation film is formed on the semiconductor layer, surrounds the active area, and has a first height in the first area and a second height higher than the first height in the second area. The first area includes a first end of the dummy memory transistor facing the memory string and a part of the device isolation film adjacent thereof. The second area includes a second end of the dummy memory transistor facing the select transistor and a part of the device isolation film adjacent thereof.

The embodiments according to the present invention will be described below in detail with reference to the drawings.

First Embodiment

Figure 1:
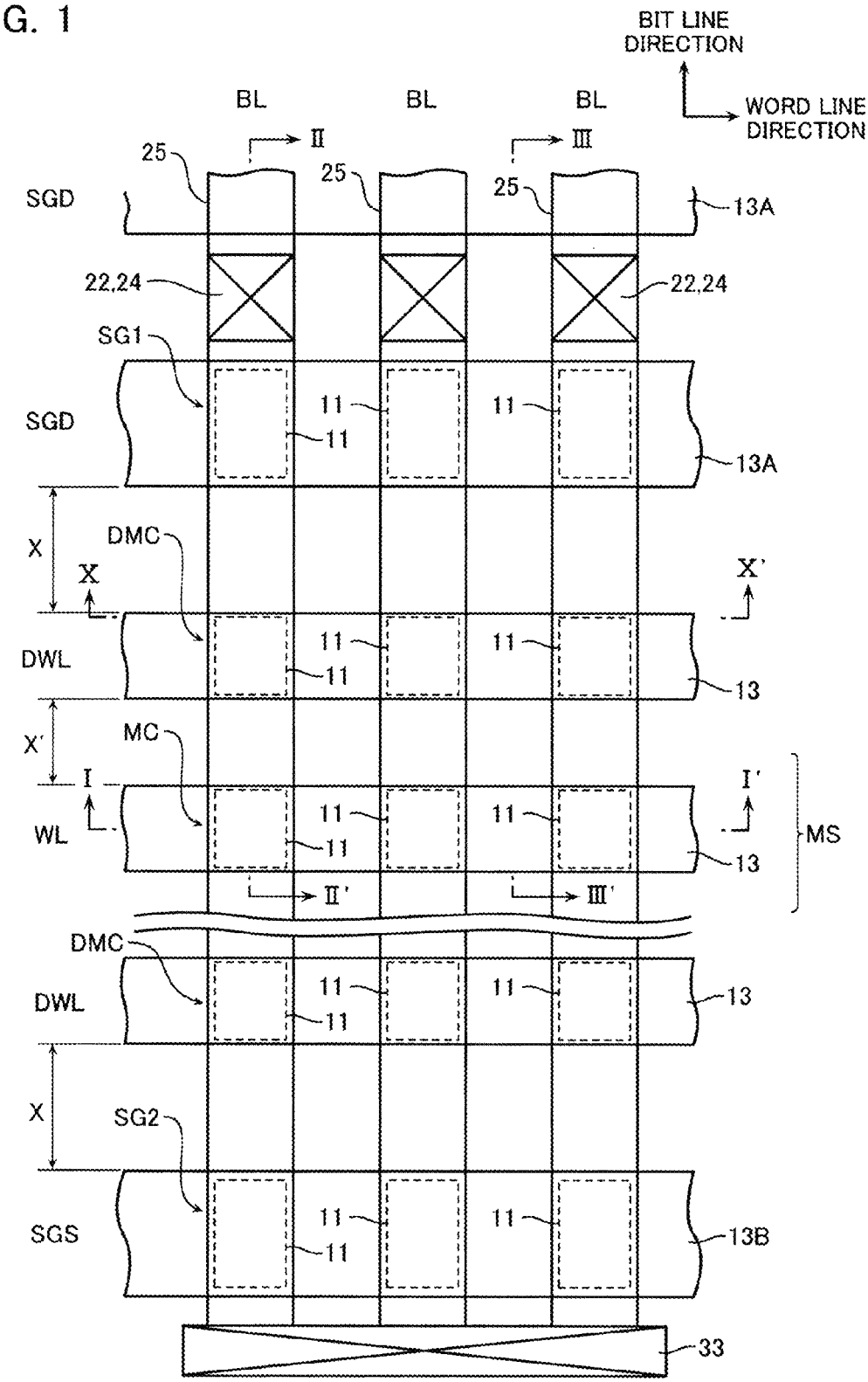
FIG. 1 shows a schematic layout of a memory cell array of a NAND flash memory according to a first embodiment.

FIG. 1 shows a schematic layout of a memory cell array of a NAND flash memory according to a first embodiment. Word lines (WL) 13 and bit lines (BL) 25 are arranged while intersecting each other and a memory transistor (memory cell) MC is formed at each intersection point therebetween.

Figure 3:
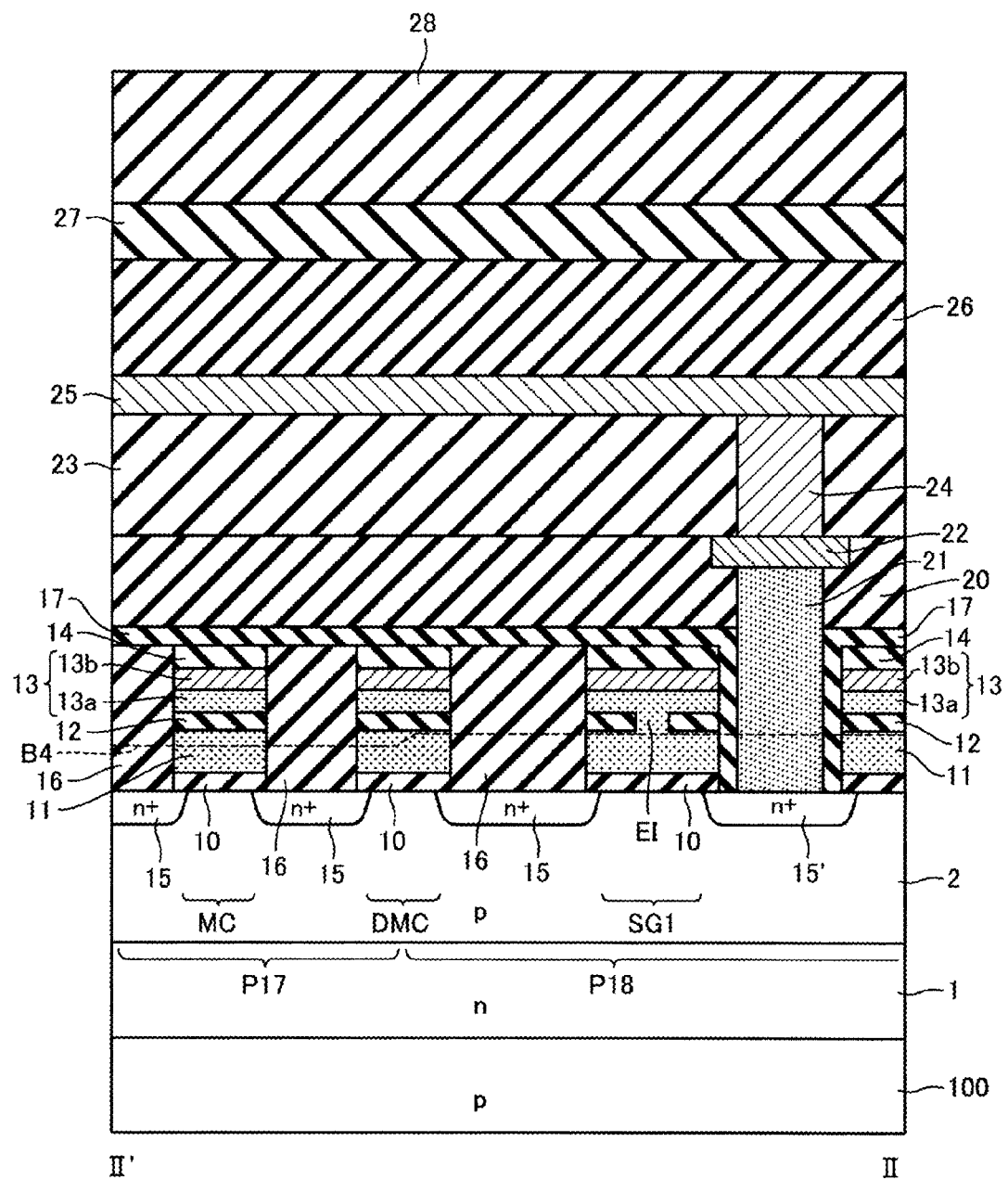
FIG. 3 is a II-II' cross-section view along a bit line BL of FIG. 1.

The memory transistors MC are connected in series and arranged in the bit line direction, and the adjacent memory transistors MC share a source/drain diffusion layer (reference numeral 15 in FIG. 3). The memory transistors MC arranged in the bit line BL direction are connected by the source/drain diffusion layers to configure a memory string MS.

One end of the memory string MS is connected to a bit line BL via a dummy memory transistor (dummy memory cell) DMC and a drain side select transistor SG1. The bit line BL is connected to the drain side select transistor SG1 via contacts 22 and 24. The dummy memory transistor DMC has substantially the same structure as the typical memory transistor MC used for storing data, but is not used for storing data. In other words, during a data write operation, a voltage to be applied to a selected memory transistor MC is not applied to the dummy memory transistor DMC. A dummy word line DWL is connected to a control gate of the dummy memory transistor DMC.

The other end of the NAND cell unit is similarly connected to a source line SL (not shown) via a dummy memory transistor DMC and a source side select transistor SG2. The source line SL is connected to the source side select transistor SG2 via a source side contact 33.

A gate of the drain side select transistor SG1 is connected to a drain side select gate line (SGD) 13A arranged in parallel to the word lines WL. A gate of the source side select transistor SG2 is connected to a source side select gate line (SGS) 13B arranged in parallel to the word lines WL. A direction in which the word lines extend is defined as word line direction and a direction in which the bit lines BL extend is defined as bit line direction. By way of example, a distance X between the dummy word line DWL and the select gate line SGD or SGS in the bit line direction is set to be wider than a distance X' between the word lines WL or between the word line WL and the dummy word line DWL. Of course, X=X' may be employed. The distance between the word line WL and the dummy word line DWL may be wider than the distance between the word lines WL.

Figure 2A:
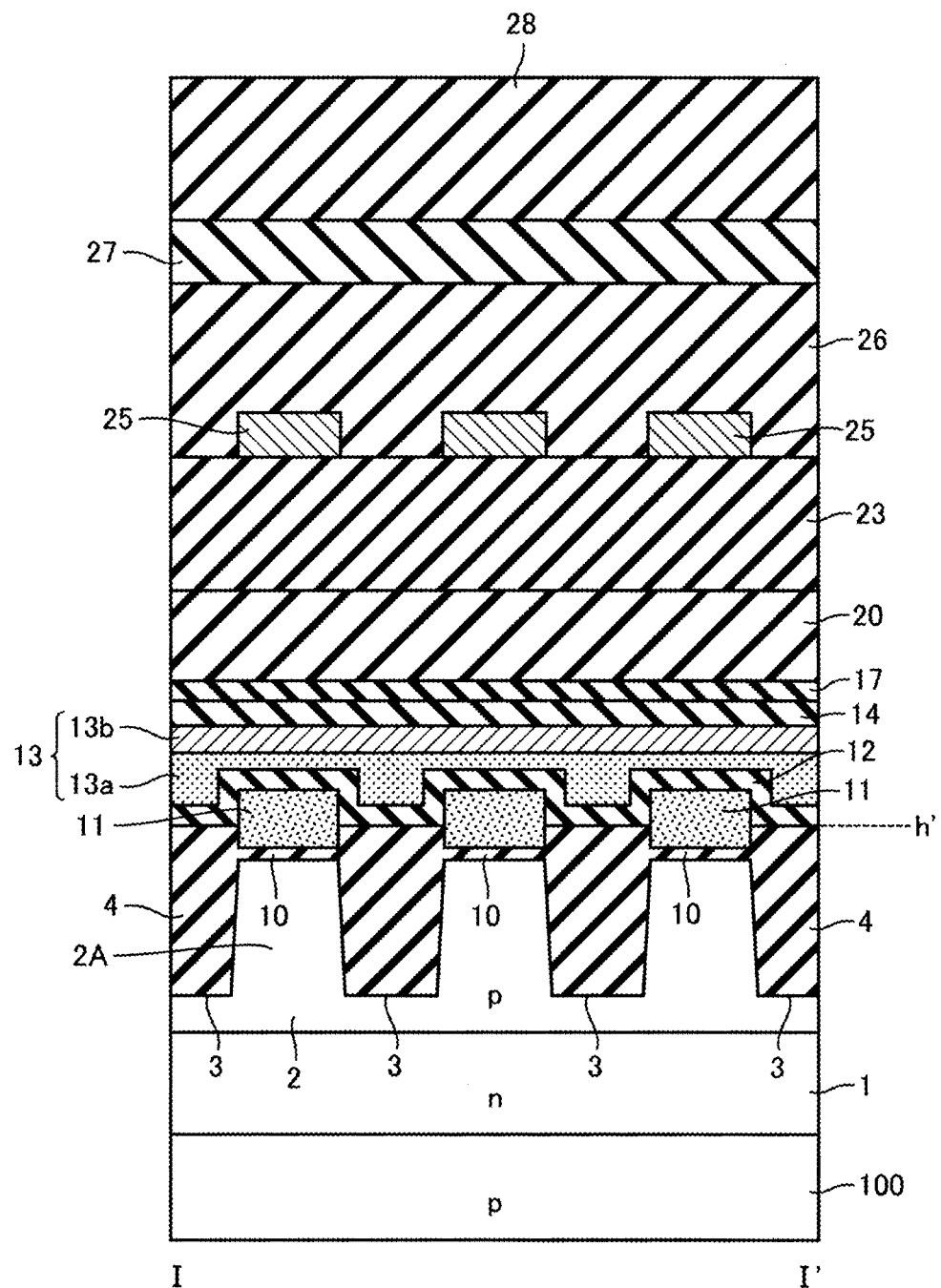
FIG. 2A is a I-I' cross-section view along a word line WL of FIG. 1.
Figure 2B:
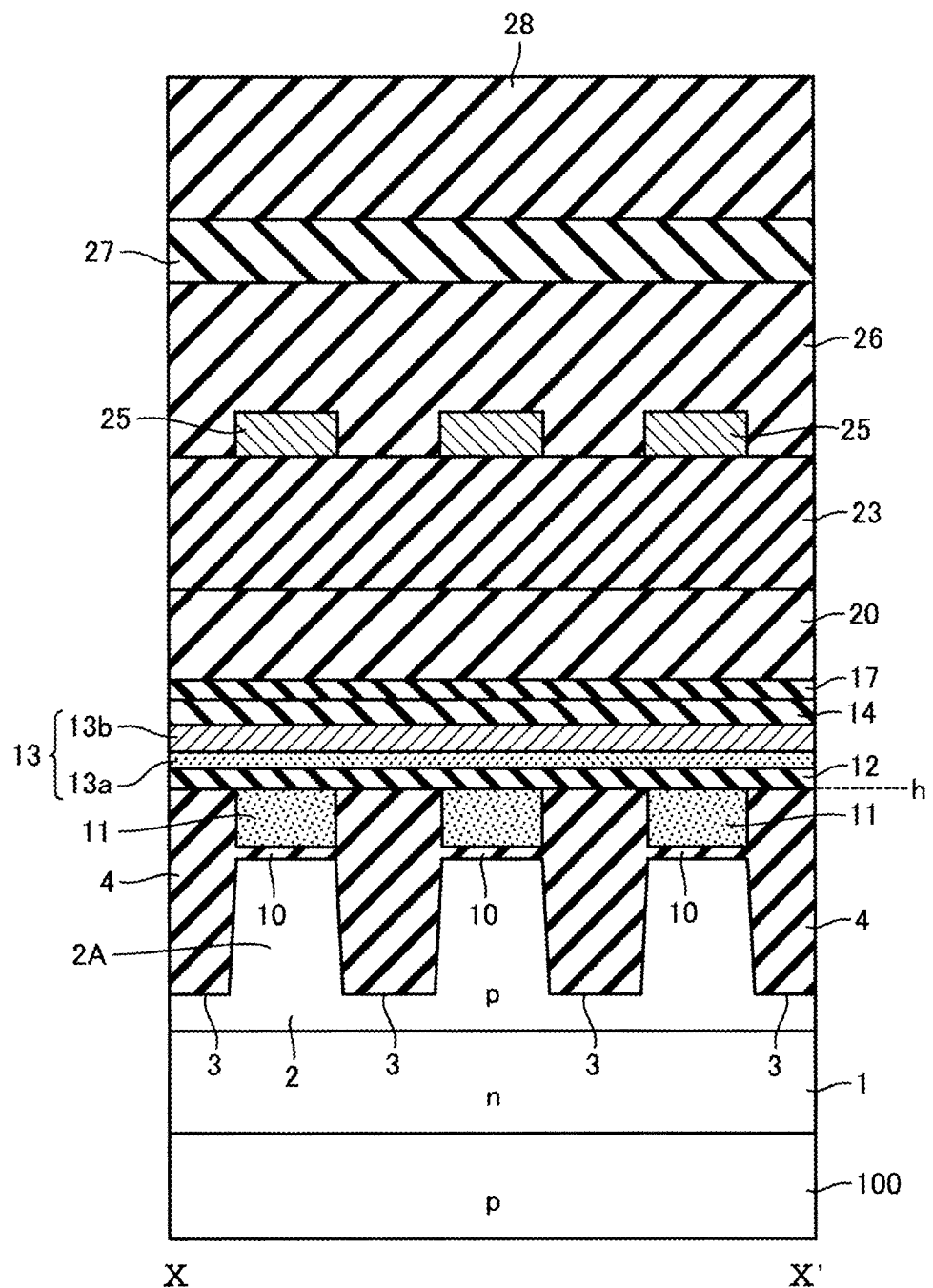
FIG. 2B is a X-X' cross-section view along a word line WL of FIG. 1.

FIG. 2A is a I-I' cross-section view along the word line WL of FIG. 1. FIG. 2B is a X-X' cross-section view along the end at the select transistor SG1 side of the dummy word line DWL of FIG. 1. FIG. 3 is a II-II' cross-section view along the bit line BL of FIG. 1. As shown in FIG. 2A, an n-type well 1 and a p-type well 2 are formed in a cell array area on a p-type silicon substrate 100. Trenches 3 are formed on the p-type well 2 at equal intervals and device isolation films 4 are formed in the trenches 3. The memory transistor MC is formed in the p-type well 2 sandwiched between the device isolation films 4. In other words, the p-type well 2 sandwiched between the device isolation films 4 functions as an active area 2A in which the memory transistor MC is formed. Similarly, as shown in FIG. 2B, the p-type well 2 sandwiched between the device isolation films 4 functions as an active area 2A in which the dummy memory transistor DMC not used for storing data is formed. Though not shown, this is applicable to the select transistors SG1 and SG2.

In FIG. 2A, the position h' of the top surface of the device isolation film 4 is set to be lower than the position of the top surface of a floating gate 11 (that is, the top surface of the floating gate 11 in the memory transistor MC is positioned higher than the position h'). Thereby, a facing area between a control gate 13 and the floating gate 11 can be increased and a coupling ratio can be enhanced.

On the other hand, as shown in FIG. 2B, the position h of the top surface of the device isolation film 4 is substantially equal to the position of the top surface of the floating gate 11 at the X-X' section, that is, at the end on the select transistor SG1 side of the dummy memory transistor DMC and its vicinity (at least at an end).

The memory transistor MC and a structure of the memory string MS will be described below with reference to FIG. 3. The floating gate 11 made of polysilicon film is formed on the active area 2A (channel area) via a tunnel oxide film 10 and the control gate 13 is formed on the floating gate 11 via an intergate insulating film 12 (such as ONO film). Instead of the floating gate 11, any type of an electric storage film such as a trap insulating film including SiN, SiON, HfSiN and HfSiON may be used. The control gate 13 is formed of a stacked film made of a polysilicon film 13a and a metal film 13b such as tungsten, tungsten nitride, tungsten silicide, nickel silicide or cobalt silicide. The control gate 13 is continuously patterned in the word line direction to be the word line WL. The same floating gate 11 and control gate 13 are formed also in the area of the select transistor SG1. In other words, the select transistor SG1 has a gate electrode formed in the same layer as the floating gate 11, a gate electrode formed in the same layer as the control gate 13, and an intergate insulating film sandwiched between the gate electrodes. In the select transistor SG1, the intergate insulating film 12 is removed by etching to form an opening (throughhole) EI, and the floating gate 11 and the control gate 13 are short-circuited via a conductive layer embedded in the opening EI (for example, a conductive film such as polysilicon film embedded when the control gate 13 is formed or in a different step). Though not shown in FIG. 3, the select transistor SG2 also has the similar structure.

The control gate 13 and the floating gate 11 are simultaneously patterned with a silicon nitride film (SiN film) 14 as a mask, and are used as masks to implant n-type impurity ions so that an n-type source/drain diffusion area 15 is formed. The diffusion area 15 is shared between the adjacent memory transistors, thereby the memory string MS in which the memory transistors MC are connected in series being formed. One ends of the dummy memory transistors DMC connected in series via the diffusion area 15 are formed at both ends of the memory string MS. The select transistors SG1 and SG2 are connected to other ends of the dummy memory transistors DMC to form a NAND cell unit. A drain contact diffusion area 15' is formed on the surface of the n-type active area 2A opposite to the memory transistor side of the select transistors SG1 and SG2. A contact plug 21 is formed on the drain contact diffusion area 15'.

An interlayer insulating film 16 is embedded between the floating gates 11 and the control gates 13 and an SiN film 17 is further deposited to cover the memory string.

The memory cell array is covered with an interlayer insulating film 20. The contact plug 21 and a wiring 22 made of first-layer metal such as tungsten are embedded in the interlayer insulating film 20. The bottom surface of the contact plug 21 is connected to the n-type drain contact diffusion area 15'. An interlayer insulating film 23 is further stacked on the interlayer insulating film 20. A contact plug 24 is embedded in the interlayer insulating film 23 and the bit line (BL) 25 such as Al film or Cu film is formed thereon. FIG. 3 shows only the contact part at the bit line side. The wiring 22 serves as a relay wiring for the bit line but the source line SL is made of the same film as the wiring 22.

A silicon oxide film 26, a SiN film 27 by plasma-CVD and a polyimide film 28 are deposited as passivation films on the bit line 25. The broken line B4 in FIG. 3 indicates the surface position of the interlayer insulating film 4 at the III-III' section described later.

Figure 4:
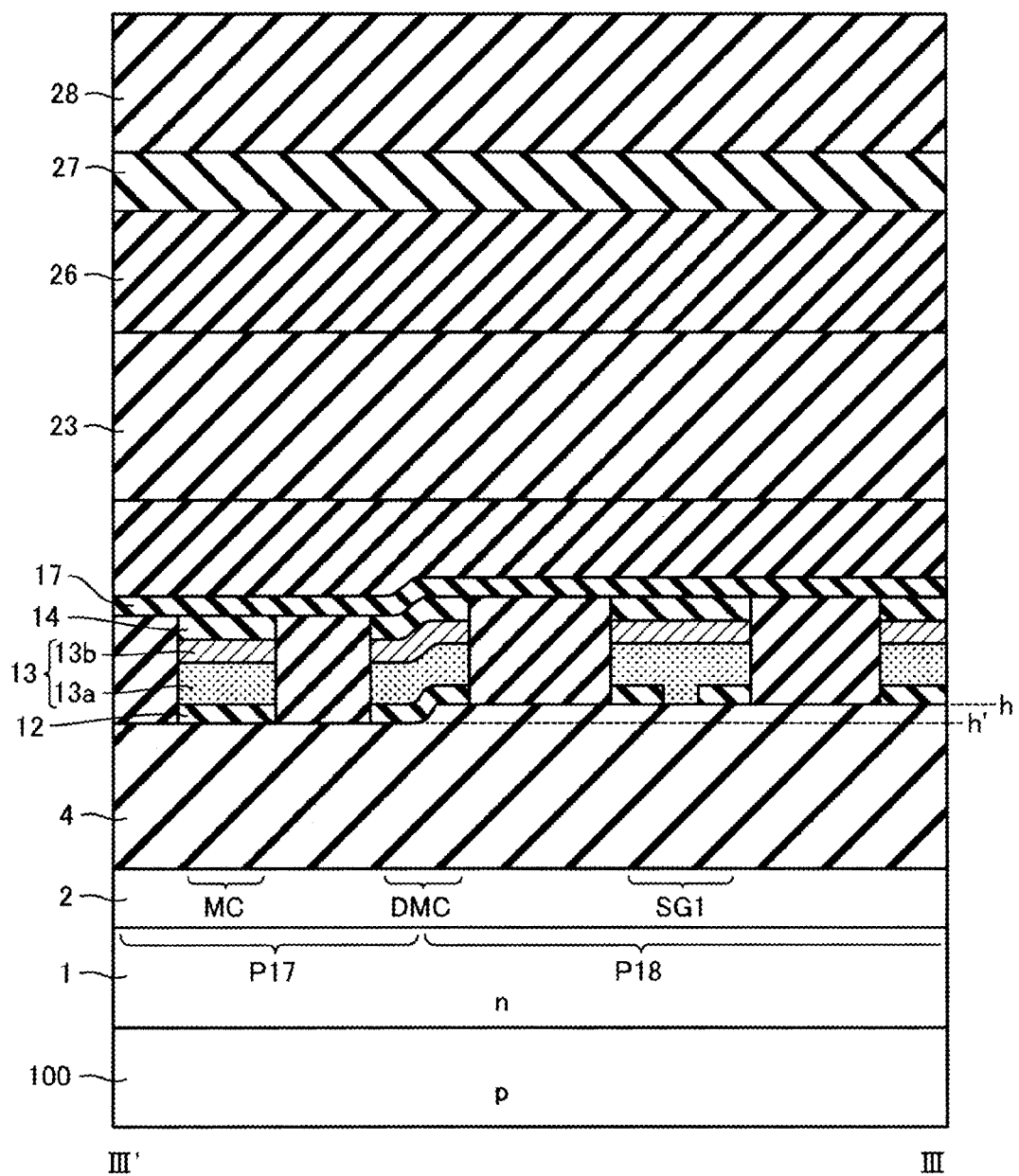
FIG. 4 is a cross-section view along III-III' of FIG. 1.

FIG. 4 is a cross-section view along III-III' of FIG. 1. At the III-III' section, the intergate insulating film 12, the polysilicon film 13a and the silicide film 13b making the control gate 13, and the silicon nitride film 14 are formed to extend in the vertical direction on the sheet of FIG. 4 in continuity with the II-II' section. The position h of the surface of the device isolation film 4 in an area P18 (second area) is higher than the position h' of the surface of the device isolation film 4 in other area P17 (first area) (see FIG. 4). In other words, in the area P18, a mask M is formed as described later and thus the device isolation film 4 is not etched back.

In this way, in the area P17, the position of the surface of the device isolation film 4 is assumed as the position h'. The position h' is lower than the position of the top surface of the floating gate 11 as shown in FIG. 2. With this structure, the facing area between the control gate and the floating gate 11 is increased, thereby increasing the coupling ratio of the memory transistors MC.

A boundary between the areas P17 and P18 is present on the dummy memory transistor DMC. In other words, the boundary between the areas P17 and P18 is present between the end at the memory string MS side of the dummy memory transistor DMC and the end of the select transistor SG1 of the dummy memory transistor DMC. That is, the device isolation film 4 is configured such that its height changes between the two ends along the III-III' section of the dummy memory transistor DMC. Though not shown in FIGS. 3 and 4, the device isolation film 4 is configured such that its height similarly changes also in the dummy memory transistor DMC at the source side select transistor SG2.

The steps of manufacturing the semiconductor memory device according to the first embodiment will be described below with reference to FIGS. 5 to 10. FIGS. 5, 6, 8 and 10 show the shape at the I-I' section of FIG. 1 in each step of the manufacturing steps. FIG. 7 shows a position where the mask M is formed when boron is implanted. FIG. 9 shows the shape of the III-III' section of FIG. 1 in each step of the manufacturing steps.

Figure 5:
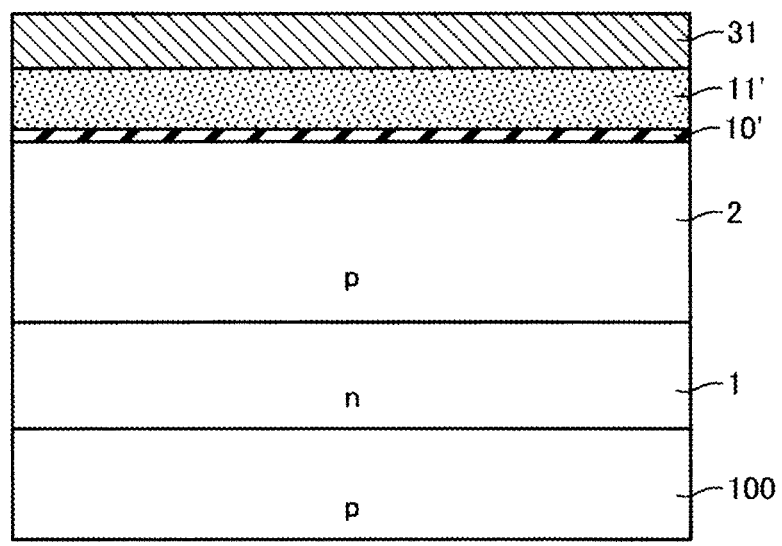
FIG. 5 is a diagram for explaining steps of manufacturing a semiconductor memory device according to the first embodiment.

At first, as shown in FIG. 5, the n-type well 1 is formed on the p-type silicon substrate 100 in the area where the memory transistor MC is formed, and the p-type well 2 is further formed thereon. An oxide film 10' as the tunnel oxide film 10 is further formed by thermal oxidation on the p-type well 2. Thereafter, a conductive film 11' (polysilicon film) as the floating gate 11, and an insulating film 31 are sequentially deposited. At this stage, ion implantation for forming impurities in the channels is not performed.

Figure 6:
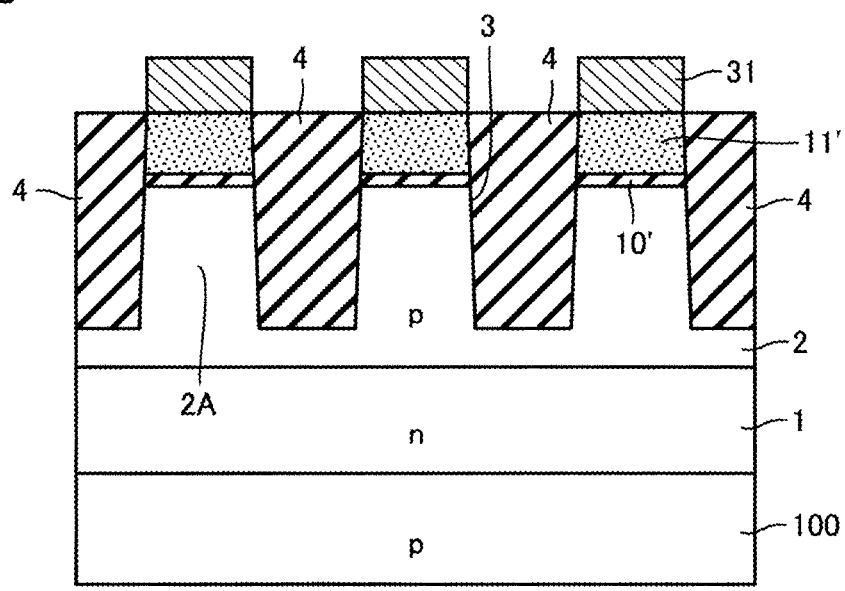
FIG. 6 is a diagram for explaining the steps of manufacturing the semiconductor memory device according to the first embodiment.
Figure 7:
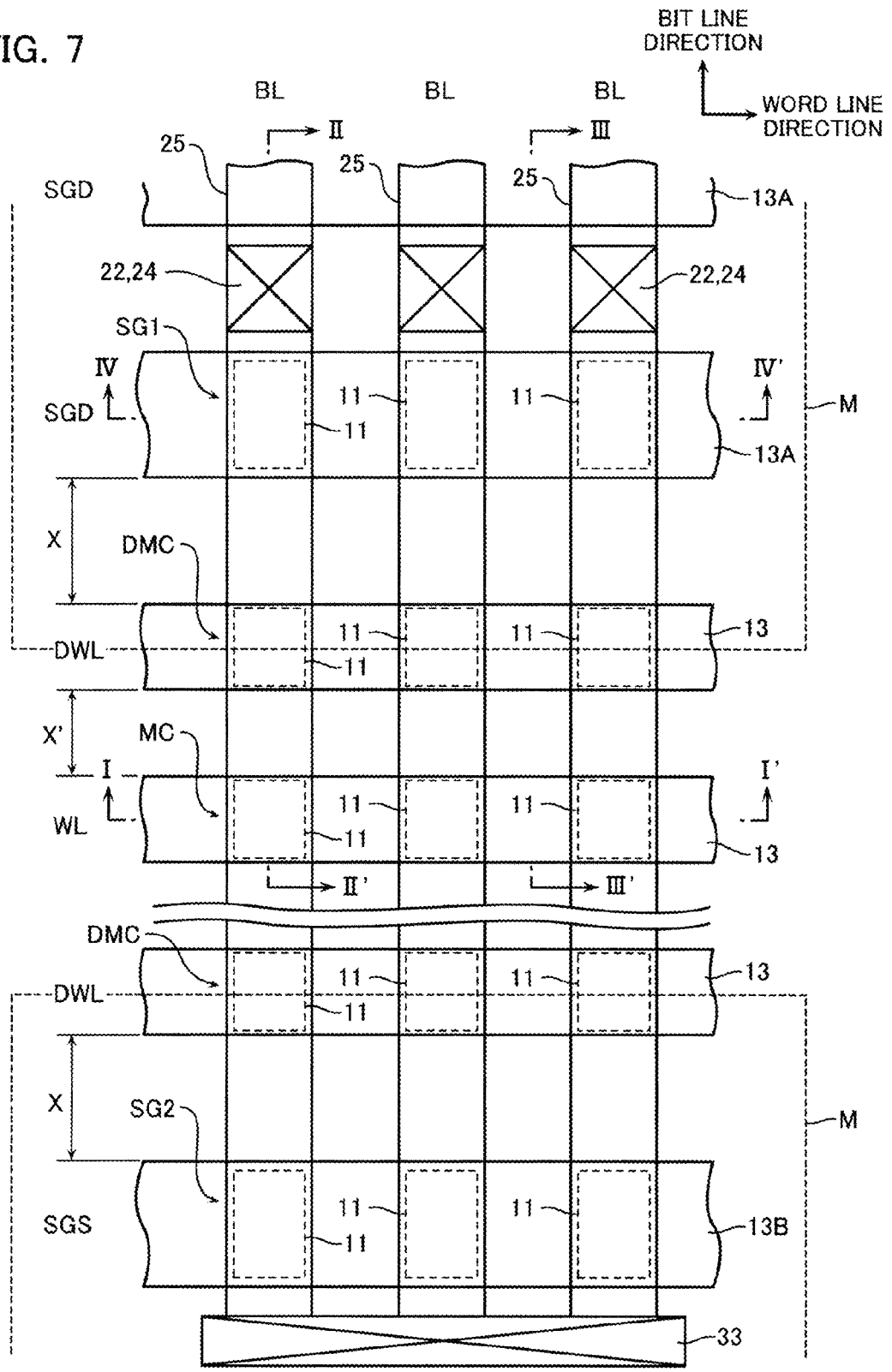
FIG. 7 is a diagram for explaining the steps of manufacturing the semiconductor memory device according to the first embodiment.

Subsequently, as shown in FIG. 6, a resist is formed on the insulating film 31, the resist is patterned according to the shape of the device isolation film 4 by a photolithography technique, and reactive ion etching (RIE) is performed with the patterned resist as a mask to etch the insulating film 31, the conductive film 11', the oxide film 10' and the p-type silicon substrate 100. Consequently, the trenches 3 leading to the p-type well 2 in the p-type silicon substrate 100 from the surface of the insulating film 31 are formed. The step of forming the trenches 3 may employ a so-called sidewall process. The area of the p-type well 2 sandwiched between the trenches 3 is the active area 2A described above. The active area 2A is formed with the vertical direction on the sheet of FIG. 6 as the longitudinal direction (that is, the longitudinal direction of the bit line BL).

Subsequently, after the resist is removed by ashing in the oxidization atmosphere, for example, a TEOS film is deposited on the entire silicon substrate 100 to embed the trenches 3. Thereafter, the etchback processing is performed with the insulating film 31 as a mask and the device isolation film 4 is formed only in the trenches 3. At this time, the top surface of the device isolation film 4 is substantially equal to the top surface of the conductive film 11'.

Thereafter, the insulating film 31 is removed and then, as shown in FIG. 7, the resist M covers the memory string MS and the half area of the dummy memory transistor DMC other than the memory string MS side. The area covered with the resist M corresponds to the area P18 shown in FIGS. 3 and 4, and the area not covered with the resist M corresponds to the area P17 shown in FIGS. 3 and 4. FIG. 7 shows the word lines 13 and the select gate lines 13A in chained lines and the contacts 22 and 24 in solid lines for facilitating the understanding of where the resist M is formed. Actually, the wiring is not present at the stage of forming the resist M. Though not shown, a peripheral circuit forming area in which a peripheral circuit is formed is also covered with the resist M.

Figure 8:
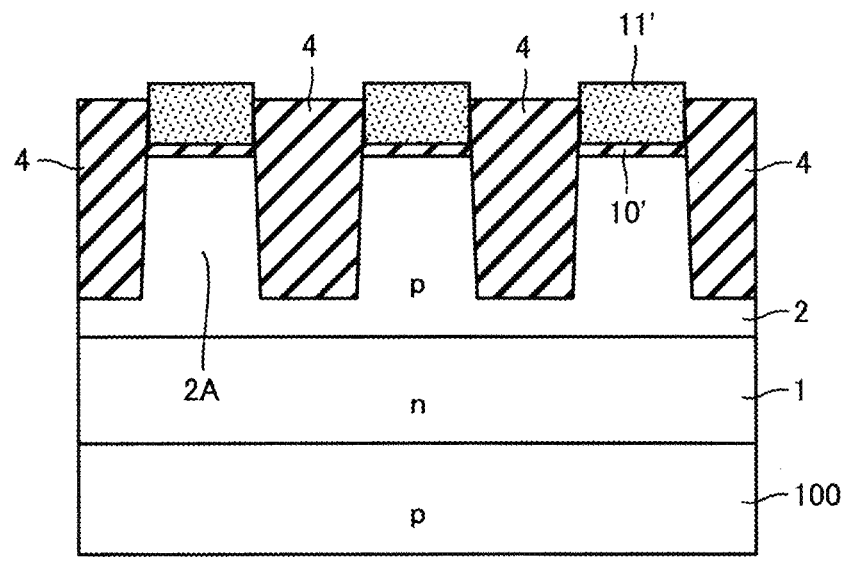
FIG. 8 is a diagram for explaining the steps of manufacturing the semiconductor memory device according to the first embodiment.
Figure 9:
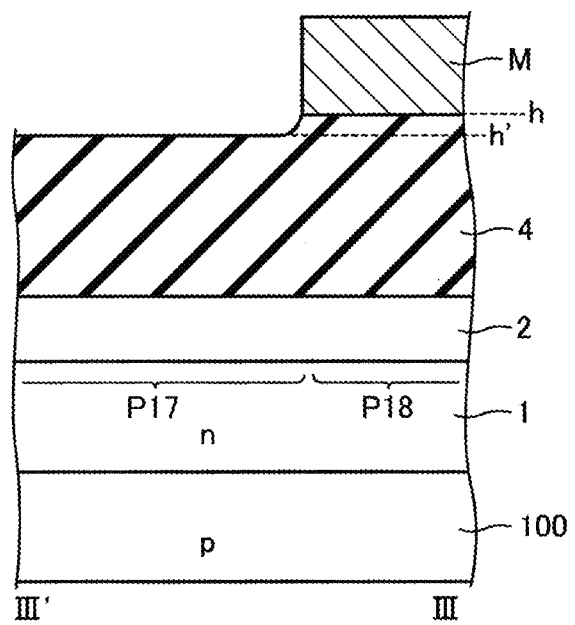
FIG. 9 is a diagram for explaining the steps of manufacturing the semiconductor memory device according to the first embodiment.

Thereafter, as shown in FIGS. 8 and 9, the device isolation film 4 in the area P17 is etched back by photolithography or RIE and its top surface is positioned below the top surface of the conductive film 11'. Consequently, the position h of the top surface of the device isolation film 4 in the area P18 is higher than the position h' of the top surface of the device isolation film 4 in the area P17.

Figure 10:
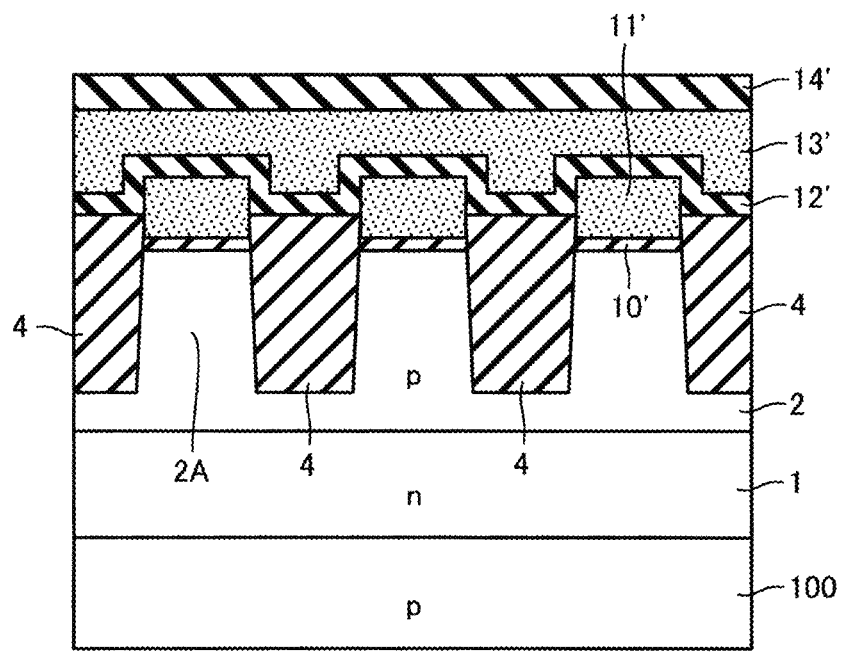
FIG. 10 is a diagram for explaining the steps of manufacturing the semiconductor memory device according to the first embodiment.

Thereafter, as shown in FIG. 10, an ONO film 12' (a stacked film of first silicon oxide film, silicon nitride film and second silicon oxide film) as the intergate insulating film 12 is formed on the top surface of the conductive layer 11' and a stacked film 13' made of polysilicon film and metal film as the control gate 13 is further formed thereon.

Then, the conductive layer 11', the ONO film 12' and the stacked film 13' are processed into the shapes of the word line WL and the select gate lines SGD and SGS (gate electrode process). Ion implantation is performed with the word line WL and the select gate lines SGD and SGS as masks to form diffusion areas 15 and 15' between the memory transistors MC, between the memory transistor MC and the dummy memory transistor DMC, between the dummy memory transistor DMC and the select transistor SG1 (or SG2) and between the select transistors SG1 (or SG2). In the following, the NAND flash memory shown in FIGS. 1 to 4 is completed in a well-known NAND flash memory manufacturing method.

Then, the effects of the first embodiment will be described below. In the memory transistor MC, as shown in FIG. 2, the position h' of the top surface of the device isolation film 4 is lower than the top surface of the floating gate 11. Thus the control gate 13 contacts with the side of the floating gate 11, thereby increasing the coupling ratio therebetween.

On the other hand, in the dummy memory transistor DMC, as shown in FIGS. 3 and 4, the position of the top surface of the device isolation film 4 is set at the position h' at the end on the memory string MS side of the dummy memory transistor DMC. In other words, the dummy memory transistor DMC has the similar structure as the cross-section view of FIG. 2A.

However, the position of the device isolation film 4 is set at the position h near the end on the select transistor SG1 (or SG2) side of the dummy memory transistor DMC (FIG. 2B, the X-X' section of FIG. 1). Therefore, the dummy word line DWL of the dummy memory transistor DMC contacts with the floating gate 11 of the dummy memory transistor DMC only at its top surface. Thus the dummy word line DWL is smaller in the coupling ratio than the memory transistor MC.

In other words, in the present embodiment, the dummy memory transistor DMC is smaller than the memory transistor MC in the coupling ratio or the facing area between the control gate 13 and the floating gate 11. With this structure, an increase in threshold due to charges in the dummy memory transistor during an erase operation can be suppressed.

Typically, during the erase operation, an erase voltage is applied to the semiconductor substrate and the select transistor SG1 (or SG2) and the memory transistor MC and the dummy memory transistor DMC remain at 0 V. At this time, the dummy memory transistor DMC is adjacent to the select transistor SG1 (or SG2) and thus a high electric field is applied to the select transistor SG1 (or SG2) of the dummy memory transistor DMC. Then, hot electrons occur due to GIDL (Gate Induced Drain Leakage) and the electrons are accumulated in the floating gate in the dummy memory transistor DMC. Consequently, the threshold of the dummy memory transistor DMC increases and a current cannot flow at a voltage to be applied during a typical read operation.

However, in the present embodiment, the position of the device isolation film 4 in the height direction is set at h' at the end on the select transistor SG1 (or SG2) side of the dummy memory transistor DMC, thereby reducing the coupling ratio.

Thus, the electric field between the dummy memory transistor DMC and the select transistor SG1 (or SG2) can be alleviated, the electrons can be suppressed from being accumulated in the floating gate of the dummy memory transistor DMC, and consequently the increase in threshold of the dummy memory transistor DMC can be suppressed.

Second Embodiment

Figure 11:
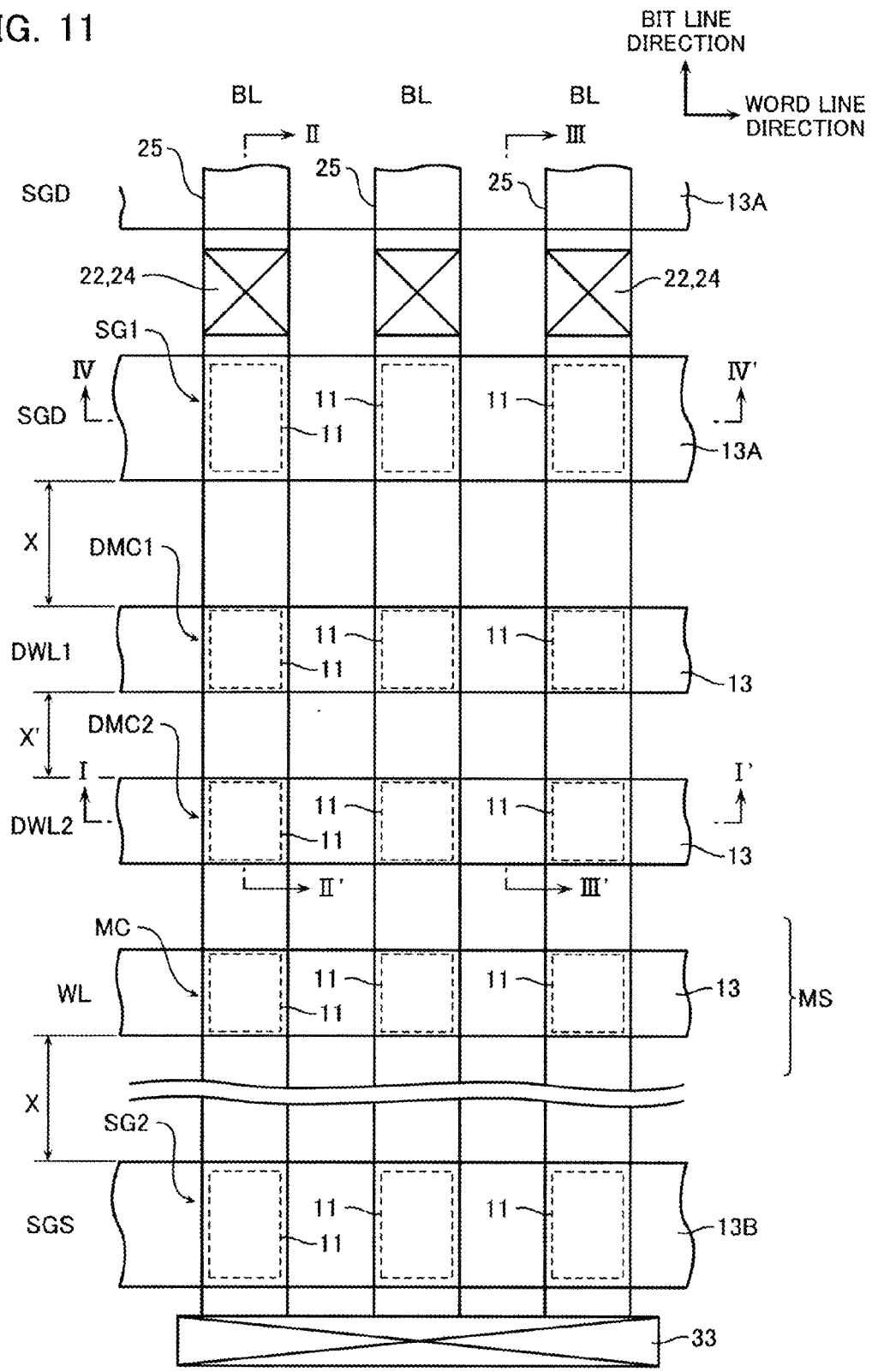
FIG. 11 shows a schematic layout of a memory cell array of a NAND flash memory according to a second embodiment.

A nonvolatile semiconductor memory device according to a second embodiment will be described below with reference to FIGS. 11 to 13. FIG. 11 shows a schematic layout of a memory cell array of a NAND flash memory according to the second embodiment. The I-I cross-section view is as shown in FIG. 2.

The nonvolatile semiconductor memory device according to the second embodiment is different from that of the first embodiment in that two dummy memory transistors DMC1 and DMC2 are connected in series between the memory string MS and the select transistor SG1 (or SG2). The dummy memory transistor DMC2 is connected to the memory string MS and the dummy memory transistor DMC1 is connected between the dummy memory transistor DMC2 and the select transistor SG1. Though not shown in FIG. 11, similar dummy memory transistors DMC1 and DMC2 are connected also between the source side select transistor SG2 and the memory string MS.

Figure 12:
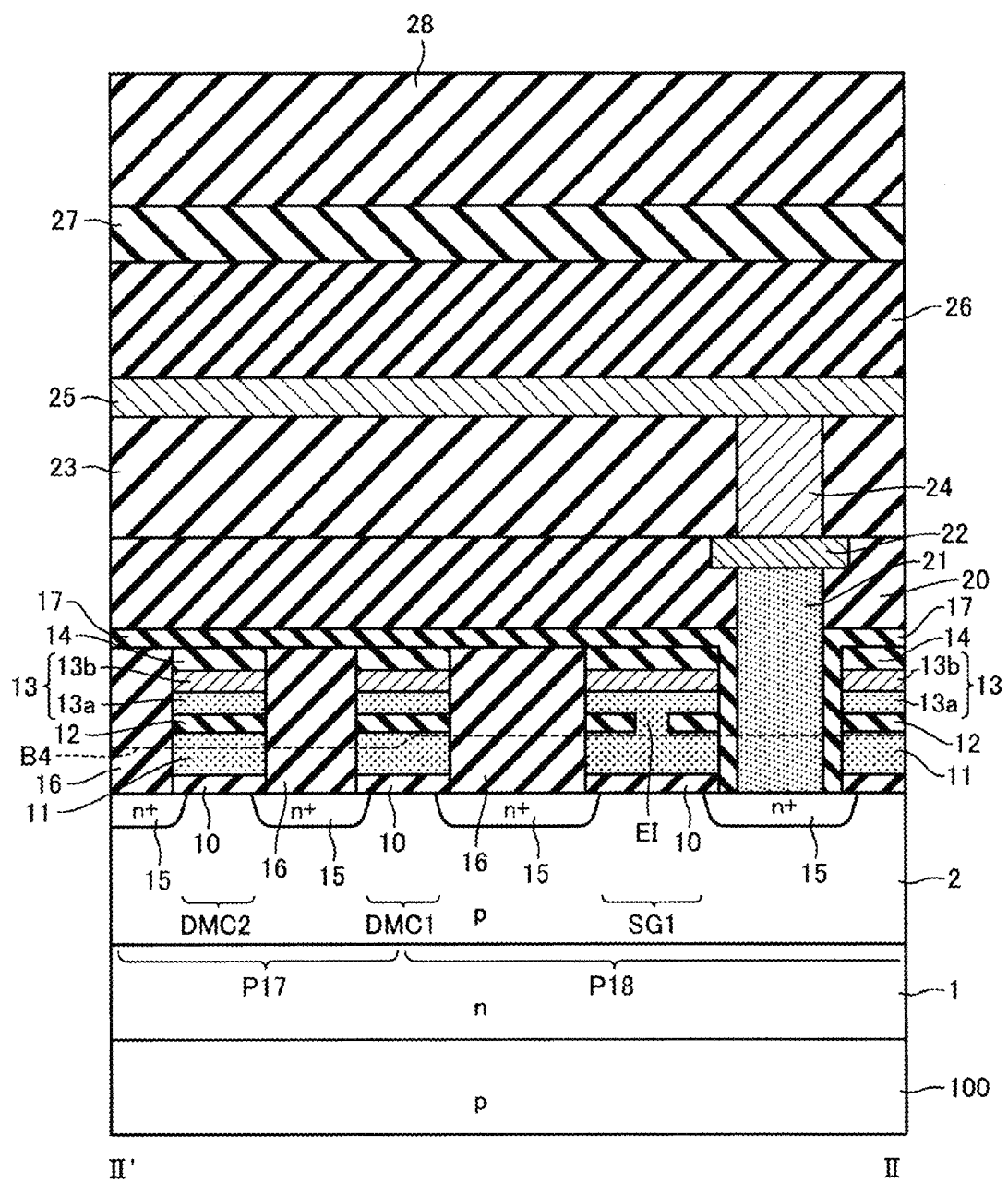
FIG. 12 is a II-II' cross-section view along a bit line BL of FIG. 11.

FIG. 12 is a cross-section view along II-II' of FIG. 11. Like reference numerals denote the same constituents as those in FIG. 3 and thus the explanation thereof will be omitted below. As shown in FIG. 12, the two dummy memory transistors DMC1 and DMC2 are connected in series to the drain side select transistor SG1. Though not shown in FIG. 12, the memory transistor MC as shown in FIG. 3 is formed to the left of the dummy memory transistor DMC2.

Figure 13:
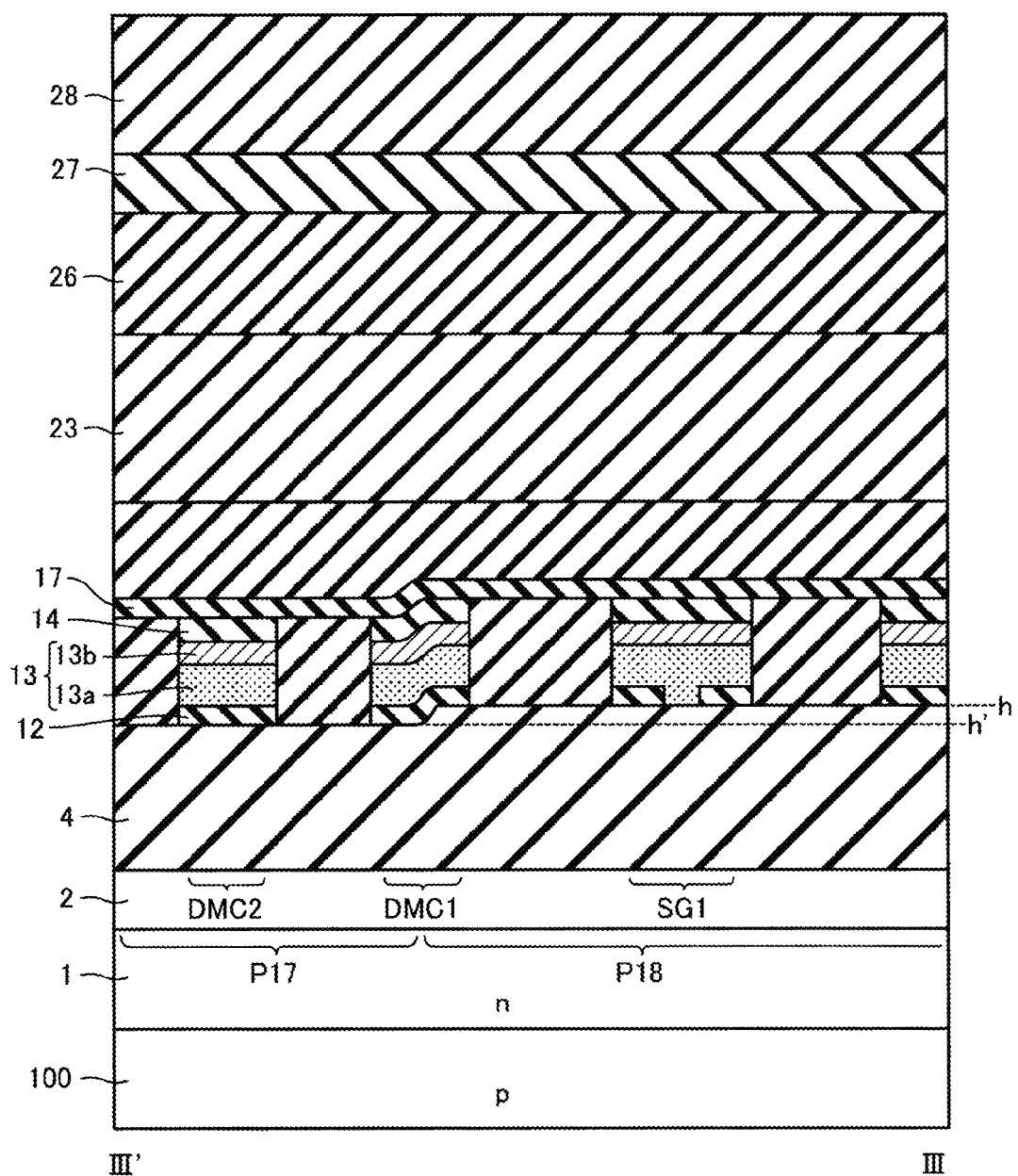
FIG. 13 is a cross-section view along III-III' of FIG. 11.

FIG. 13 is a cross-section view along III-III' of FIG. 11. Like reference numerals denote the same constituents as those in FIG. 4 and thus the explanation thereof will be omitted below.

In the second embodiment, like the first embodiment, the position h of the surface of the device isolation film 4 in the area P18 (second area) is higher than the position h' of the surface of the device isolation film 4 in other area P17 (first area) (see FIG. 13). The boundary between the areas P17 and P18 is set between both ends of the dummy memory transistor DMC1.

According to the second embodiment, similar effects to the first embodiment can be obtained.

Third Embodiment

A nonvolatile semiconductor memory device according to a third embodiment will be described below with reference to FIGS. 14 and 15. A schematic layout is similar to the second embodiment (FIG. 11). The I-I' cross-section view is as shown in FIG. 2.

Figure 14:
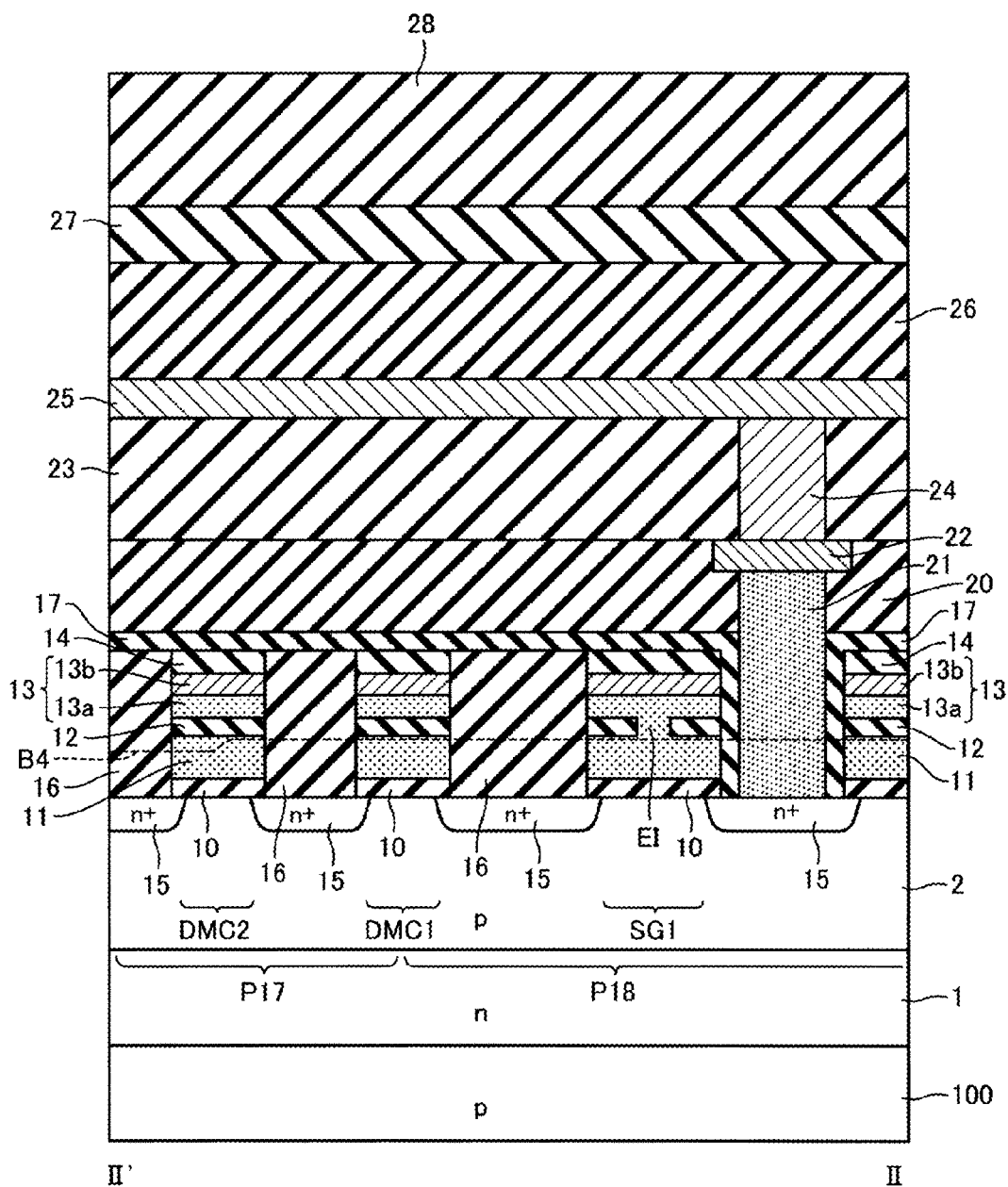
FIG. 14 is a II-II' cross-section view of a memory cell array of a NAND flash memory according to a third embodiment.
Figure 15:
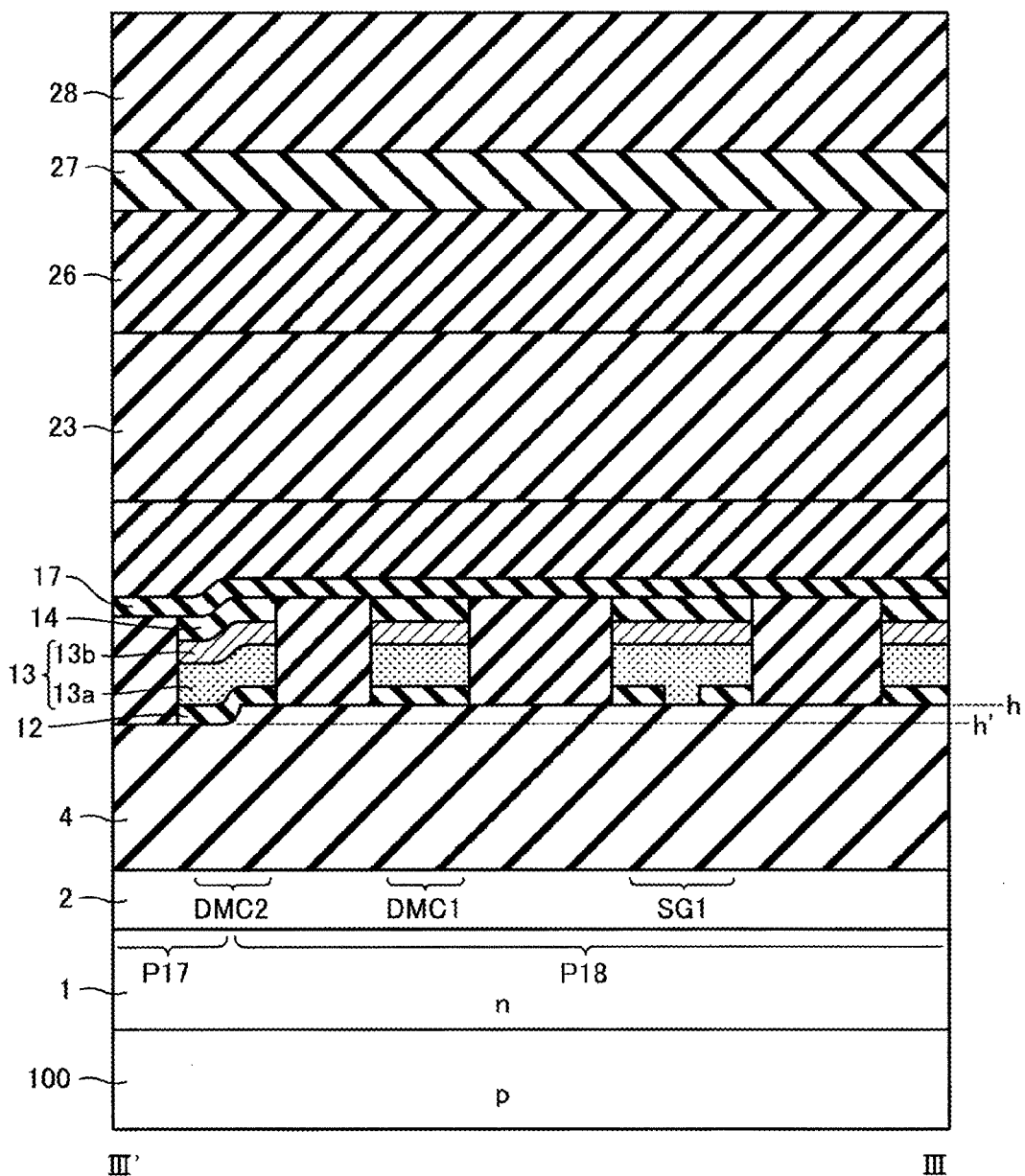
FIG. 15 is a III-III' cross-section view of the memory cell array of the NAND flash memory according to the third embodiment.

FIG. 14 is a cross-section view along II-II' of FIG. 11. FIG. 15 is a cross-section view along III-III' of FIG. 11. Like reference numerals denote the same constituents as those in FIG. 3 and thus the explanation thereof will be omitted below.

In the third embodiment, like the previous embodiments, the position h of the surface of the device isolation film 4 in the area P18 (second area) is higher than the position h' of the surface of the device isolation film 4 in other area P17 (first area) (see FIG. 13). The boundary between the areas P17 and P18 is set between both ends of the dummy memory transistor DMC2.

According to the third embodiment, similar effects to the first embodiment can be obtained.

Fourth Embodiment

A nonvolatile semiconductor memory device according to a fourth embodiment will be described below with reference to FIGS. 16 and 17. A schematic layout is similar to the second embodiment (FIG. 11). The I-I cross-section view is as shown in FIG. 2.

Figure 16:
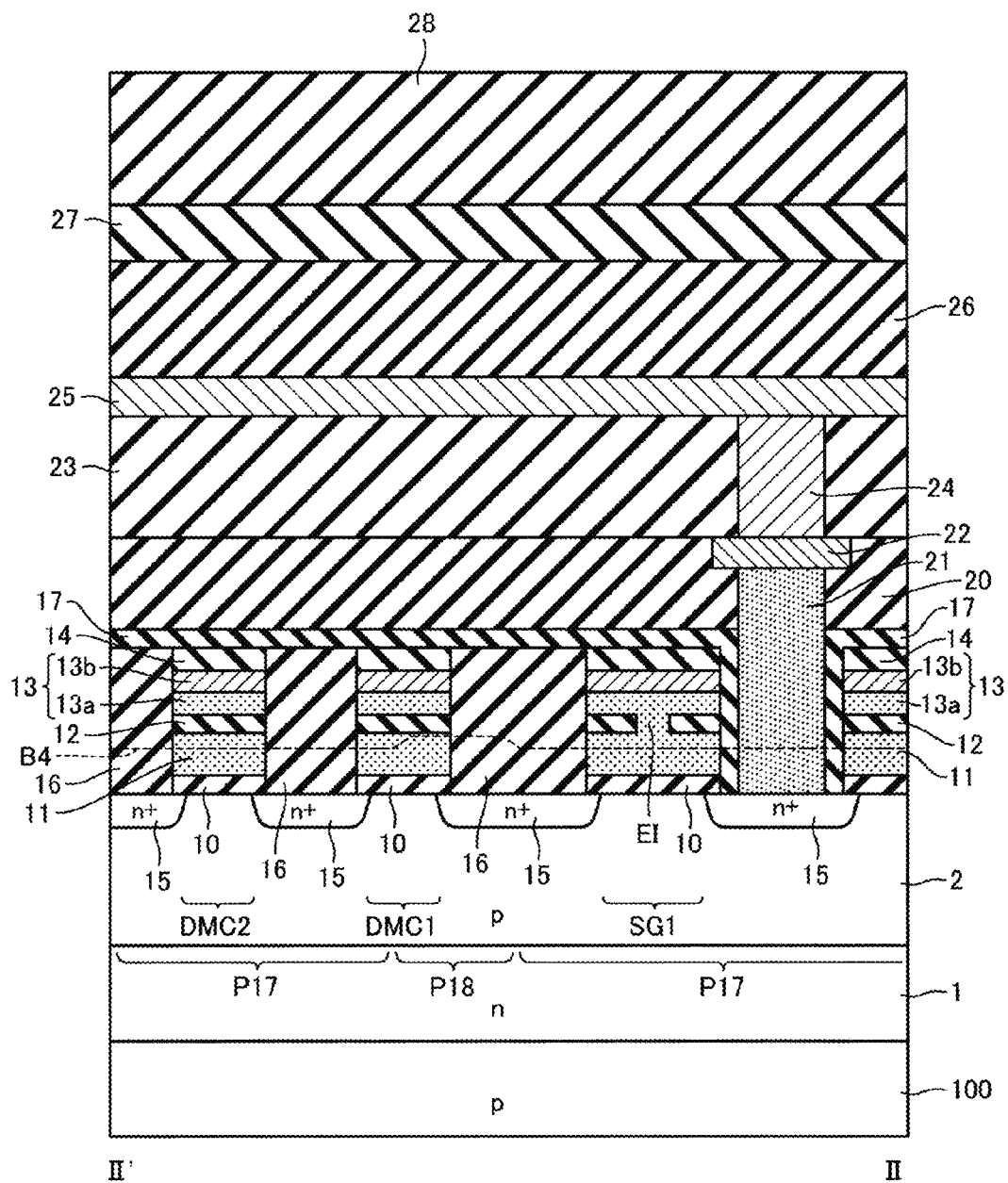
FIG. 16 is a II-II' cross-section view of a memory cell array of a NAND flash memory according to a fourth embodiment.
Figure 17:
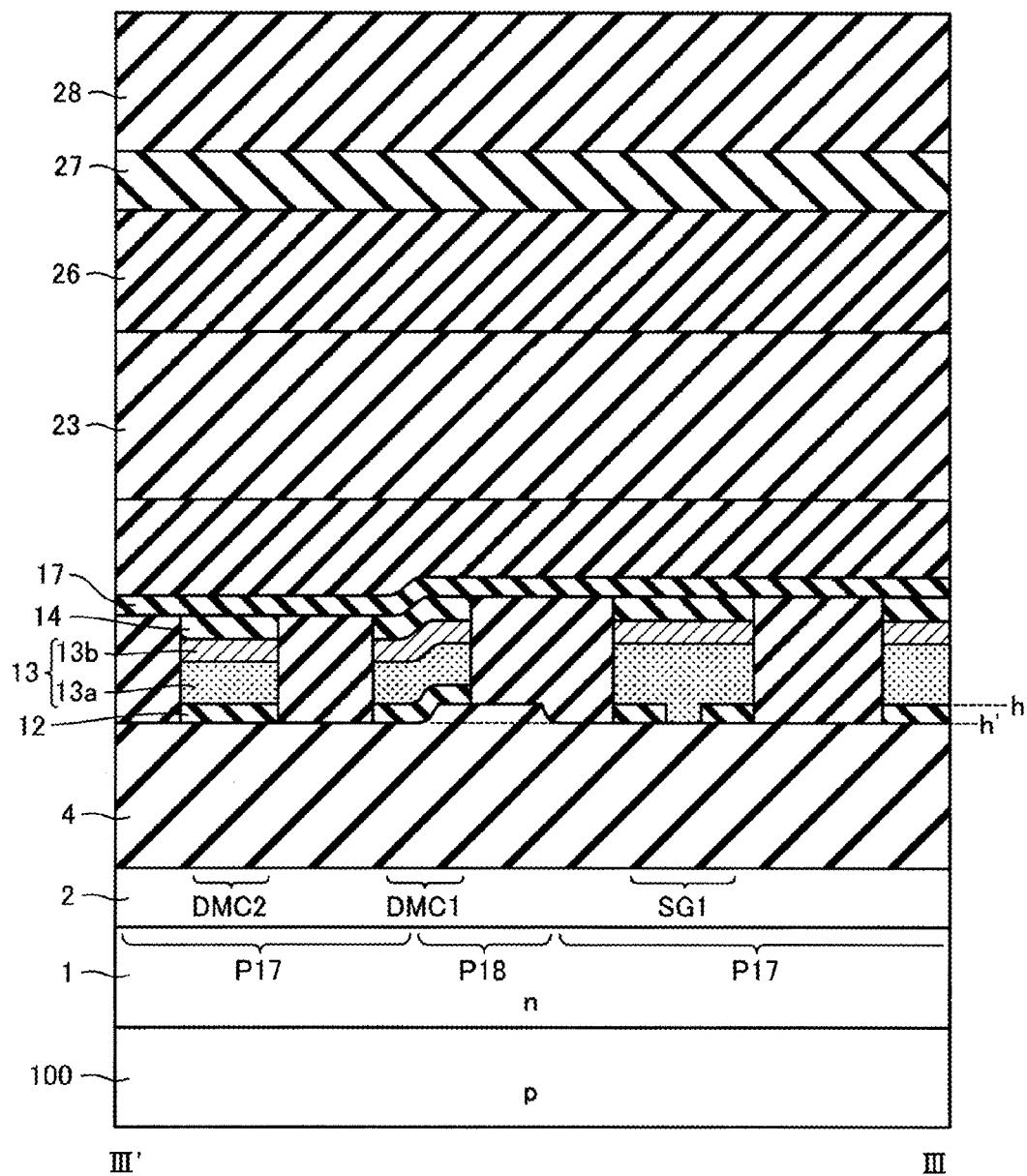
FIG. 17 is a III-III' cross-section view of the memory cell array of the NAND flash memory according to the fourth embodiment.

FIG. 16 is a cross-section view along II-II' of FIG. 11. FIG. 17 is a cross-section view along III-III' of FIG. 11. Like reference numerals denote the same constituents as those in FIG. 3 and thus the explanation thereof will be omitted below.

In the fourth embodiment, like the previous embodiments, the position h of the surface of the device isolation film 4 in the area P18 (second area) is higher than the position h' of the surface of the device isolation film 4 in other area P17 (first area) (see FIG. 13). In the present embodiment, the area P18 is present only in a narrow place including the end at the select transistor SG1 (or SG2) side of the dummy memory transistor DMC1. The select transistor SG2 is also formed in the area P17. In other words, the boundary between the areas P17 and P18 is set between both ends of the dummy memory transistor DMC1 and between the dummy memory transistor DMC1 and the select transistor SG1 (or SG2).

According to the present embodiment, the following effects can be obtained in addition to the effects according to the first to third embodiments. As shown in FIG. 17, since the select transistor SG1 (or SG2) is also formed in the area P17, the thickness of the gate electrode 13a of the select transistors SG1 and SG2 on the device isolation film 4 can be larger than the thickness of the gate electrode 13a of the memory transistor MC or the dummy memory cell DMC2. In other words, the thickness of the gate electrode of the select transistors SG1 and SG2 can be further increased than that of the select transistors according to the first embodiment. Thereby, a wiring resistance of the select gate lines SGD and SGS can be reduced. FIGS. 19 and 20 show that the two dummy memory transistors DMC1 and DMC2 are connected in series, while the device isolation film as shown in FIGS. 19 and 20 can be formed even when a single dummy memory transistor DMC is present between the memory string MS and the select transistor as in the first embodiment. Further, the boundary between the areas P17 and P18 may be set between both ends of the dummy memory transistor DMC2 and between the dummy memory transistor DMC1 and the select transistor SG1 (or SG2).

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A nonvolatile semiconductor memory device comprising:
a semiconductor layer having a first area and a second area;
an active area formed in the semiconductor layer, extending in a first direction, and including a select transistor, a first memory transistor, and a second memory transistor, the select transistor, the first memory transistor, and the second memory transistor being connected in series; and a device isolation film formed on the semiconductor layer, extending in the first direction, being adjacent to the active area, and having a first height in the first area and a second height higher than the first height in the second area, the first area including a first end of the first memory transistor facing the second memory transistor and a first part of the device isolation film adjacent thereof, and the second area including a second end of the first memory transistor facing the select transistor and a second part of the device isolation film adjacent thereof.

2. The nonvolatile semiconductor memory device according to claim 1, wherein the first memory transistor and the second memory transistor comprise an electric storage film formed above the active area via a first gate insulating film, and a control gate formed above the electric storage film via a first insulating film, a top surface of the electric storage film of the second memory transistor is formed at a higher position than the first height, and a top surface of the electric storage film of the first memory transistor is formed at substantially the same height as the second height at least at the second end of the first memory transistor.

3. The nonvolatile semiconductor memory device according to claim 2, wherein the electric storage film has a polysilicon film.

4. The nonvolatile semiconductor memory device according to claim 1, wherein the second area includes the select transistor and a third part of the device insulation film adjacent thereof.

5. The nonvolatile semiconductor memory device according to claim 4, wherein the first memory transistor and the second memory transistor comprise an electric storage film formed above the active area via a first gate insulating film, and a control gate formed on the electric storage film via a first insulating film, the select transistor comprises a first gate formed above the active area via a second gate insulating film, a second gate formed above the first gate via a second insulating film, and the second insulating film having a through hole embedded with a conductive film, and a thickness of the second gate is higher than that of the control gate on the device isolation film.

6. The nonvolatile semiconductor memory device according to claim 4, wherein the first part of the device isolation film, the second part of the device isolation film, and the third part of the device isolation film are arranged continuously.

7. The nonvolatile semiconductor memory device according to claim 4, wherein the first part of the device isolation film, the second part of the device isolation film, and the third part of the device isolation film are arranged in the first direction.

8. The nonvolatile semiconductor memory device according to claim 1, further comprising:

a plurality of the active areas are arranged in a second direction crossing to the first direction;

a second word line commonly connected to gates of the second memory transistors arranged in the second direction;

a first word line commonly connected to gates of the first memory transistors arranged in the second direction; and a select gate line commonly connected to gates of the select transistors arranged in the second direction, wherein a distance between the second word line and the first word line adjacent to each other is shorter than a distance between the first word line and the select gate line adjacent to each other.

9. The nonvolatile semiconductor memory device according to claim 1, wherein the first part of the device isolation film and the second part of the device isolation film are arranged continuously.

10. The nonvolatile semiconductor memory device according to claim 1, wherein the first part of the device isolation film and the second part of the device isolation film are arranged in the first direction.

* * * * *